(12) United States Patent
Jansson et al.

(10) Patent No.: US 8,512,807 B2
(45) Date of Patent: Aug. 20, 2013

(54) METHOD OF MAKING CUTTING TOOL INSERTS WITH HIGH DEMANDS ON DIMENSIONAL ACCURACY

(75) Inventors: Bo Jansson, Ramsberg (SE); Jacob Sjolen, Fagersta (SE)

(73) Assignee: Seco Tools AB, Fagersta (SE)

( * ) Notice: Subject to any disclaimer, the term of this patent is extended or adjusted under 35 U.S.C. 154(b) by 175 days.

(21) Appl. No.: 13/139,119

(22) PCT Filed: Dec. 9, 2009

(86) PCT No.: PCT/SE2009/051392
§ 371 (c)(1),
(2), (4) Date: Jun. 10, 2011

(87) PCT Pub. No.: WO2010/068168
PCT Pub. Date: Jun. 17, 2010

(65) Prior Publication Data
US 2011/0244129 A1    Oct. 6, 2011

(30) Foreign Application Priority Data
Dec. 10, 2008   (SE) ...................................... 0802544

(51) Int. Cl.
*C23C 16/30*   (2006.01)

(52) U.S. Cl.
USPC ................ 427/249.1; 427/249.7; 427/255.31; 427/255.34; 427/255.36; 427/255.391; 427/376.3

(58) Field of Classification Search
USPC ................... 427/249.1, 249.7, 376.3, 255.31, 427/255.34, 255.36, 255.393
See application file for complete search history.

(56) References Cited

U.S. PATENT DOCUMENTS

| | | | |
|---|---|---|---|
| 5,066,553 A | | 11/1991 | Yoshimura et al. |
| 2003/0075016 A1* | 4/2003 | Uenosono et al. .............. 75/246 |
| 2005/0117984 A1* | 6/2005 | Eason et al. .................. 408/144 |
| 2007/0110607 A1* | 5/2007 | Iwasaki et al. ................ 419/15 |
| 2007/0218242 A1* | 9/2007 | Moriguchi et al. ............. 428/98 |
| 2008/0224344 A1* | 9/2008 | Westergren et al. .......... 264/109 |
| 2008/0292737 A1* | 11/2008 | Banerjee ........................ 425/10 |
| 2011/0320037 A1* | 12/2011 | Frugone ........................ 700/237 |
| 2012/0093597 A1* | 4/2012 | Ederyd .......................... 407/119 |

FOREIGN PATENT DOCUMENTS

| | | |
|---|---|---|
| EP | 1 247 879 A2 | 10/2002 |
| JP | 5195223 A | 8/1993 |
| JP | 10225804 A | 8/1998 |
| JP | 2003247006 A | 9/2003 |

OTHER PUBLICATIONS

Cha, Seung I., et al., "Microstructures of binderless tungsten carbides sintered by spark plasma sintering process". Materials Science and Engineering A356 (2003) 381-389.*

Mizukami, Yoshiaki, et al., "Fabrication of Cemented Carbide Molds with Internal Cooling Channels Using Hybrid Process of Powder Layer Compaction and Milling". Materials Transactions, vol. 46, No. 11 (2005) pp. 2497-2503.*

International Search Report, dated Apr. 1, 2010 from corresponding PCT application.

* cited by examiner

*Primary Examiner* — Bret Chen
(74) *Attorney, Agent, or Firm* — Young & Thompson

(57) ABSTRACT

A method of making cutting tool inserts with high demands on dimensional accuracy includes:
 mixing by milling of powders forming hard constituents and binder phase,
 forming the powder mixture to bodies of desired shape,
 sintering the formed bodies,
 grinding with high accuracy the sintered bodies to inserts with desired shape and dimension,
 optionally edge rounding of cutting edges, and
 providing the ground inserts with a wear resistant non-diamond or non-diamond-like coating. According to the method, the ground inserts are heat treated prior to the coating operation in an inert atmosphere or vacuum or other protective atmosphere below the solidus of the binder phase for such a time that the micro structure of the surface region is restructured without causing significant dimensional changes. In this way inserts with unexpected improvement of tool life and dimensional accuracy have been achieved.

20 Claims, 3 Drawing Sheets

METHOD OF MAKING CUTTING TOOL INSERTS WITH HIGH DEMANDS ON DIMENSIONAL ACCURACY

BACKGROUND OF THE INVENTION

1. Field of the Invention

The present invention relates to a method which improves the strength of the surface and edge of tools with high demands on dimensional accuracy for metal cutting applications. Such inserts are normally ground to desired dimension. Inserts for threading are an example, but the method is not limited to that type of metal cutting application. By heat treating the inserts after grinding them to final shape and dimension an unexpected increase in tool life has been obtained.

2. Description of the Related Art

Metal cutting by the use of coated cemented carbide or cermet tools is today the most commonly material in today's metal working industry. It is performed with high productivity and by the use of indexable inserts with cutting edges in the shape of the appropriate form. An example of a threading insert is shown in FIG. 1. The complex shape of a thread and the high demand on tolerances are produced by pressing and sintering followed by high accuracy grinding, edge honing and finally a wear resistant coating. The grinding and edge honing does, however, introduce defects in the surface on a microscopic scale, in terms of fractured carbide grains, cracks and deformed binder phase. These defects lead to poor coating adhesion and increased risk of fracture of the cutting edges during metal cutting.

U.S. Pat. No. 5,068,148 discloses a tool insert including a tungsten carbide based cemented carbide substrate and a diamond coating deposited thereon. For manufacturing the insert, a compact is first sintered to provide a tungsten carbide based cemented carbide substrate. Subsequently, the substrate is ground and then heat-treated at a temperature between 1000° C. and 1600° C. in vacuum or in a non-oxidizing atmosphere. Subsequently, a diamond coating is formed on the substrate by vapor-deposition method.

U.S. Pat. No. 5,701,578 discloses a method of making a coated insert comprising the steps of: providing a sintered substrate that includes hard grains bonded together by metallic binder, removing material from the sintered substrate to form an as-ground substrate, reducing the residual stresses in the substrate, resintering the substrate, and depositing a diamond layer thereon.

U.S. Pat. No. 5,066,553 discloses a surface-coated tool insert which has a tungsten carbide based cemented carbide substrate and a hard coating formed thereon. The coating may have one or more layers. The cobalt content of the substrate in a surface portion at a depth of about 2 µm from a surface thereof is less than that in an interior portion at a depth of about 100 µm from said surface by at least 10%. It is produced by the steps of:
  preparing a tungsten carbide based cemented carbide substrate by conventional means,
  grinding said substrate to impart stress to tungsten carbide grains near the surface of said substrate and to partly crush the tungsten carbide grains into smaller grains,
  heat-treating said cemented carbide at a temperature of no less than the WC—Co eutectic temperature to recrystallize the tungsten carbide grains and
  forming a hard coating on said substrate by chemical vapour deposition.

EP 1247879 provides an uncoated insert for turning of titanium. By using inserts with a reduced length of primary land compared to prior art an unexpected increase in tool life and productivity has been obtained. Said positive results are further improved by subjecting the inserts to an additional heat treatment after grinding to final shape and dimension.

SUMMARY OF THE INVENTION

It is an object of the present invention to provide inserts with high demands on dimensional accuracy with improved performance.

It has now been found that if inserts are subjected to a heat treatment below the solidus of the binder after the grinding operation an unexpected increase in tool life and no significant geometric distortions are achieved.

The invention thus relates to a method of making cemented carbide or cermet inserts with high demands on dimensional accuracy, such as threading inserts, comprising hard constituents and binder phase by
  mixing by milling of powders forming hard constituents and binder phase,
  forming the powder mixture to bodies of desired shape,
  sintering the formed bodies,
  grinding with high accuracy the sintered bodies to inserts with desired shape and dimension,
  possibly edge rounding of cutting edges,
  heat treating the ground inserts in an inert atmosphere or vacuum or other protective atmosphere below the solidus of the binder phase for such a time that the micro structure of the surface region is restructured without causing significant dimensional changes, preferably at temperatures of 1050-1250° C., most preferably at 1150°-1250° C., and preferably for 30-120 min, most preferably for 60-90 min.
  providing the ground and heat treated inserts with a non-diamond or non-diamond-like wear resistant coating.

BRIEF DESCRIPTION OF THE DRAWING FIGURES

DETAILED DESCRIPTION OF THE INVENTION

The invented method can be applied to all kinds of cemented carbides or cermets. It is particularly useful for cemented carbides having a composition of 3-15, preferably 5-13 wt-% Co, up to 25 wt-%, preferably 0-15 wt-%, one or more of the cubic carbide forming elements from groups IVb, Vb and VIb of the periodic table, preferably Ti, Nb and/or Ta.

The wear resistant coating can be deposited with either Physical Vapour Deposition (PVD) or Chemical Vapour Deposition (CVD) known in the art, preferably by arc evaporation PVD technique. In one embodiment the coating comprises at least one layer of $(Ti_{1-x}Al_x)N$, where $0.4<x<0.7$ with a thickness of 1-5 µm. In another embodiment the coating comprises at least one layer of $Al_2O_3$, preferably of the α-phase, said layer with a thickness of 1-15 μm. In a preferred embodiment the coating comprises a layer of cubic carbonitride in the form of $TiC_xN_yO_z$ and a layer of a metal oxide in the form of $Al_2O_3$ with a total coating thickness of 2-25 μm.

Inserts made according to the present invention are useful for all kinds of machining operations with high demands on dimensional accuracy, preferably threading operations. It is particularly useful for demanding operations of threading gas tight pipes for oil and gas applications.

EXAMPLE 1

Figure 1:
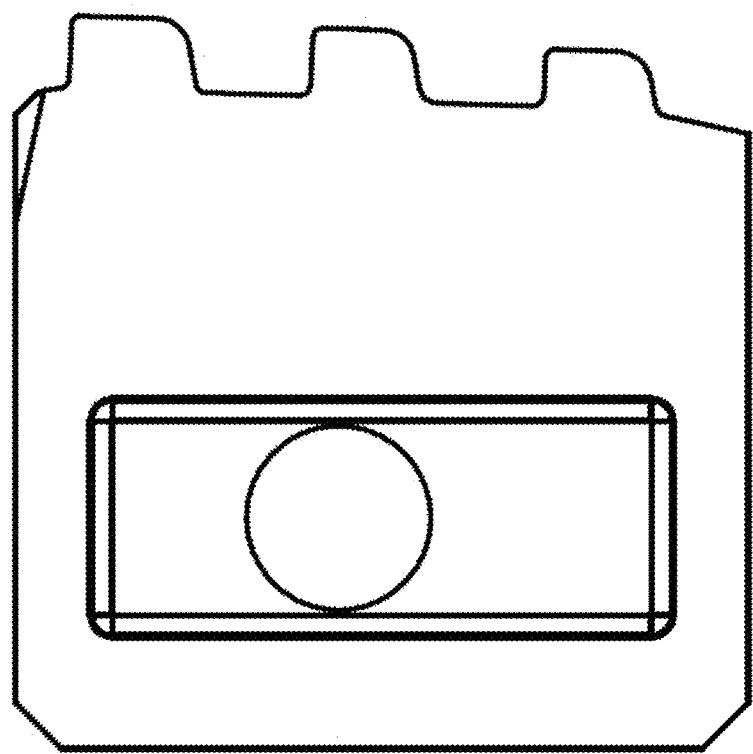
FIG. 1 shows an example of an insert for threading which requires high dimensional stability.

Cemented carbide threading insert of type Seco Tools 5-1113, see FIG. 1, consisting of a substrate and a coating were prepared. The substrate was made by milling, pressing and sintering. The composition was 5.9 wt-% Co, 2.3 wt-% NbC, 3.6 wt-% TaC, 2.5 wt-% TiC and rest WC. Average WC grain size was about 1 μm. The inserts were ground to accurate shape and brushed to an edge-radius of 70 μm.

EXAMPLE 2

Inserts from example 1 were heat treated according to the invention at 1200° C. for 1.4 h in argon atmosphere at 1000 mbar.

Figure 2:
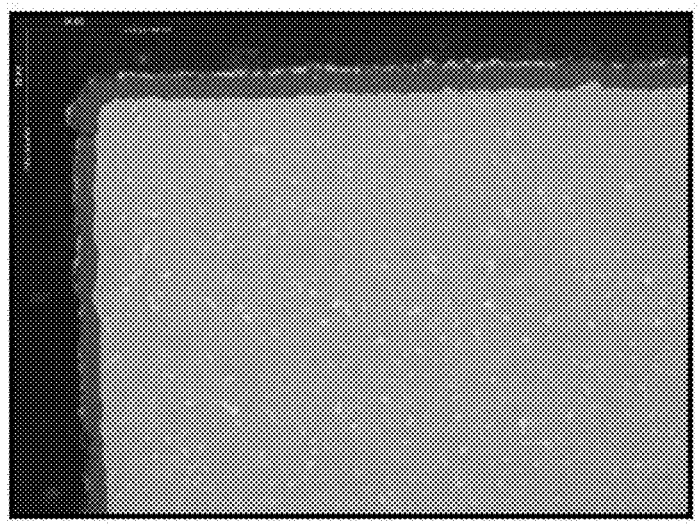
FIG. 2 shows an SEM image of a cross section of a grinded, heat treated and coated insert according to the invention.

A 2 μm thick $(Ti_{0.34}Al_{0.66})N$ layer was deposited, using arc evaporation of a TiAl cathode in reactive $N_2$ atmosphere at a total pressure of 4.0 Pa. The inserts were negatively biased at −110 V during deposition. The deposition temperature was about 400° C. FIG. 2 shows an SEM image of a cross section of an insert.

EXAMPLE 3

Inserts from example 1 were heat treated according to the invention at 1240° C. for 1 h in vacuum.

A CVD coating consisting of 4 μm Ti(C,N)+3 μm α-$Al_2O_3$ layer was deposited. The deposition temperature was about 850° C. during deposition of Ti(C,N) and 1030° C. during deposition of $Al_2O_3$.

EXAMPLE 4

Figure 3:
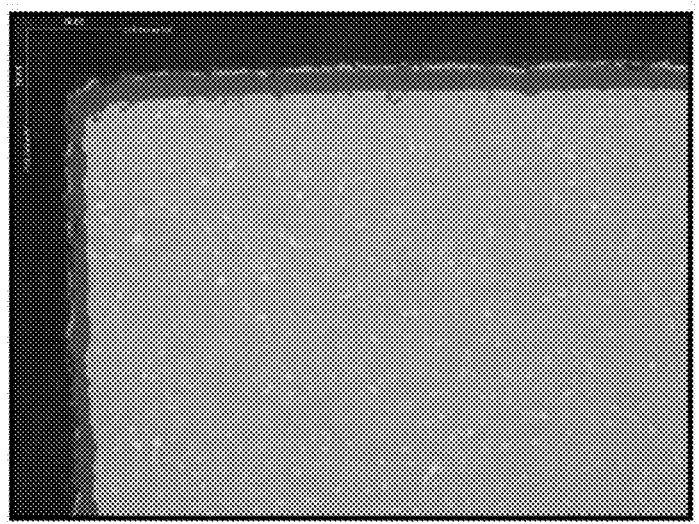
FIG. 3 shows an SEM image of a cross section of a grinded and coated insert according to prior art.

A 2 μm thick $(Ti_{0.34}Al_{0.66})N$ layer was deposited on inserts from example 1, using arc evaporation of a TiAl cathode in reactive $N_2$ atmosphere at a total pressure of 4.0 Pa. The inserts were negatively biased at −110 V during deposition. The deposition temperature was about 400° C. FIG. 3 shows an SEM image of a cross section of an insert.

EXAMPLE 5

Inserts from Example 1 were heat treated at 1400° C. for 1 h in argon atmosphere at 40 mbar. The heat treatment resulted in that the inserts were outside the geometrical tolerances.

EXAMPLE 6

Figure 4:
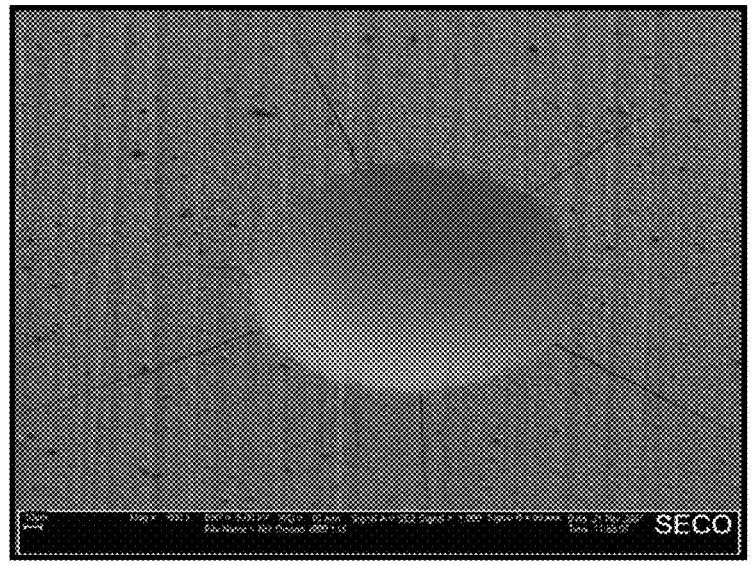
FIG. 4 shows an SEM image of the effect of a Rockwell indentation on the surface of a grinded, heat treated and coated insert according to the invention.
Figure 5:
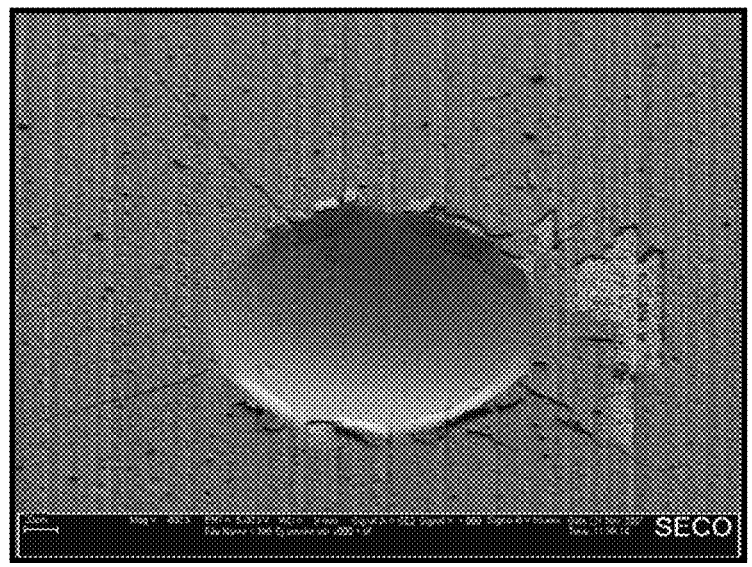
FIG. 5 shows an SEM image of the effect of a Rockwell indentation on the surface of a grinded and coated insert according to prior art.

The adhesion between coating and substrate of inserts from example 2 and 4 was determined by Rockwell A indentation tests. FIG. 4 shows the result for inserts according to example 2. FIG. 5 shows the result for inserts according to example 4. It is evident that inserts according to the invention show superior adhesion between substrate and coating.

EXAMPLE 7

Coated inserts from Example 2, 3 and 4 were tested with regard to tool life at the following conditions: Example 4 is the present state of the art and serves as reference.

Cutting data:
Rotation speed: n=380 rev/min
Cutting speed: $v_c$=233 m/min
Feed: f=5.080 mm/rev
Application Internal threading
Tool: Seco 5-1113
Work piece:
Diameter: ⌀192.87-⌀196.40 mm
Length L=254.50 mm
Material: L80-1 (API-standard)
Hardness: 750 N/mm²
Results:
The tool life criterion was the maximum time in cut in minutes at a cutting speed of 233 m/min chipping or fracture of a cutting tooth were the typical reasons for failure.

Example 2 (PVD-coated): Average insert lifetime: 31 parts (6 inserts tested)
Example 3 (CVD-coated): Average insert lifetime: 29 parts (4 inserts tested)
Example 4 (Reference PVD-coated): Average insert lifetime: 9 parts (6 inserts tested)

This test shows that the inserts according to the invention can more than triple the tool life compared to the state of the art.

The invention claimed is:

1. A method of making cemented carbide or cermet inserts comprising ceramic constituents and a metallic binder phase, the ceramic constituents being harder than the metallic binder phase, comprising:
   mixing by milling of powders forming the ceramic constituents and the metallic binder phase;
   forming the powder mixture to bodies of desired shape,
   sintering the formed bodies;
   grinding the sintered bodies to inserts to a desired shape and dimension;
   optionally edge rounding of cutting edges;
   heat treating the ground inserts in an inert atmosphere or vacuum or other protective atmosphere below a solidus of the binder phase for such a time that a micro structure of a surface region is restructured without causing significant dimensional changes; and
   following the heat treating, coating the heat treated inserts to provide a non-diamond or non-diamond-like coating.

2. The method according to claim 1, wherein the heat treating is at temperatures of 1050-1250° C. for 30-120 min.

3. The method according to claim 2, wherein the cemented carbide has a composition of 3-15 wt-% Co, up to 25 wt-% of one or more of cubic carbide forming elements from groups IVb, Vb and VIb of the periodic table.

4. The method according to claim 2, wherein the coating comprises at least one layer of $(Ti_{1-x}Al_x)N$, where 0.4<x<0.7 with a thickness of 1-5 μm deposited by PVD.

5. The method according to claim 2, wherein the coating comprises at least one layer of $Al_2O_3$, said layer with a thickness of 1-15 μm deposited by CVD.

6. The method according to claim 1, wherein the cemented carbide has a composition of 3-15 wt-% Co, and up to 25 wt-% of one or more of cubic carbide forming elements from groups IVb, Vb and VIb of the periodic table.

7. The method according to claim 6, wherein the coating comprises at least one layer of $(Ti_{1-x}Al_x)N$, where 0.4<x<0.7 with a thickness of 1-5 μm deposited by PVD.

8. The method according to claim 6, wherein the coating comprises at least one layer of $Al_2O_3$, said layer with a thickness of 1-15 μm deposited by CVD.

9. The method according to claim 1, wherein the coating comprises at least one layer of $(Ti_{1-x}Al_x)N$, where $0.4<x<0.7$ with a thickness of 1-5 µm deposited by PVD.

10. The method according to claim 1, wherein the coating comprises at least one layer of $Al_2O_3$, said layer with a thickness of 1-15 µm deposited by CVD.

11. The method according to claim 10, wherein the $Al_2O_3$ is α-phase $Al_2O_3$.

12. The method according to claim 1, wherein the inserts are threading inserts.

13. The method according to claim 1, wherein the heat treating is at temperatures of 1150°-1250° C. for 60-90 min.

14. The method according to claim 1, wherein the cemented carbide has a composition of 5-13 wt-% Co, and up to 15 wt-%, of one or more of cubic carbide forming elements selected from the group consisting of Ti, Nb and Ta.

15. A method of making cemented carbide or cermet inserts, comprising:
    providing a sintered substrate formed from a metallic binder phase and a ceramic;
    grinding the sintered substrate to inserts to a desired shape and dimension;
    heat treating the ground inserts in an inert atmosphere or vacuum or other protective atmosphere at a temperature below a solidus of the metallic binder phase at a temperature of 1050-1250° C. for such a time that a micro structure of a surface region is restructured without causing significant dimensional changes; and
    following the heat treating, coating the heat treated inserts to provide a non-diamond or non-diamond-like coating.

16. The method according to claim 15, wherein the ceramic has a grain size of about 1 µm.

17. The method according to claim 15, wherein the heat treating is for 30-120 min.

18. The method according to claim 15, wherein the cemented carbide has a composition of 3-15 wt-% Co, and up to 25 wt-% of one or more of cubic carbide forming elements from groups IVb, Vb and VIb of the periodic table.

19. The method according to claim 15, wherein the coating comprises at least one layer of $(Ti_{1-x}Al_x)N$, where $0.4<x<0.7$ with a thickness of 1-5 µm deposited by PVD.

20. The method according to claim 15, wherein the coating comprises at least one layer of $Al_2O_3$, said layer with a thickness of 1-15 µm deposited by CVD.

* * * * *